US008822973B2

(12) United States Patent
Liu

(10) Patent No.: US 8,822,973 B2
(45) **Date of Patent: *Sep. 2, 2014**

(54) MEMORY CELLS AND METHODS OF FORMING MEMORY CELLS

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/180,483

(22) Filed: Feb. 14, 2014

(65) Prior Publication Data

US 2014/0158972 A1 Jun. 12, 2014

Related U.S. Application Data

(63) Continuation of application No. 13/556,956, filed on Jul. 24, 2012, now Pat. No. 8,653,496, which is a continuation of application No. 12/872,899, filed on Aug. 31, 2010, now Pat. No. 8,247,789.

(51) Int. Cl.
*H01L 45/00* (2006.01)

(52) U.S. Cl.
CPC ............ *H01L 45/1253* (2013.01); *H01L 45/06* (2013.01); *H01L 45/144* (2013.01)
USPC ................ 257/4; 257/2; 257/5; 257/E45.001; 365/148

(58) Field of Classification Search
USPC ...................... 257/2, 4, 5, E45.001, E45.002, 257/E45.003; 365/148
See application file for complete search history.

(56) References Cited

U.S. PATENT DOCUMENTS

| | | | | |
|---|---|---|---|---|
| 7,417,245 | B2 | 8/2008 | Happ et al. | |
| 7,728,319 | B2 | 6/2010 | Goux et al. | |
| 7,729,162 | B2 | 6/2010 | Dennison et al. | |
| 8,247,789 | B2 * | 8/2012 | Liu | 257/4 |
| 8,653,496 | B2 * | 2/2014 | Liu | 257/4 |
| 2006/0246712 | A1 | 11/2006 | Kim et al. | |
| 2006/0266992 | A1 | 11/2006 | Matsui et al. | |
| 2007/0108433 | A1 | 5/2007 | Lee et al. | |
| 2007/0272987 | A1 | 11/2007 | Kang et al. | |
| 2008/0055969 | A1 | 3/2008 | Liu | |
| 2008/0210923 | A1 | 9/2008 | Sato | |
| 2009/0032794 | A1 | 2/2009 | Hsiao | |
| 2010/0051896 | A1 | 3/2010 | Park et al. | |

* cited by examiner

*Primary Examiner* — Matthew W Such
*Assistant Examiner* — Scott Stowe
(74) *Attorney, Agent, or Firm* — Wells St. John P.S.

(57) ABSTRACT

Some embodiments include a memory cell that contains programmable material sandwiched between first and second electrodes. The memory cell can further include a heating element which is directly against one of the electrodes and directly against the programmable material. The heating element can have a thickness in a range of from about 2 nanometers to about 30 nanometers, and can be more electrically resistive than the electrodes. Some embodiments include methods of forming memory cells that include heating elements directly between electrodes and programmable materials.

19 Claims, 3 Drawing Sheets

10 34 33 32 40 30 20b 20a 20 12 12 14 15

MEMORY CELLS AND METHODS OF FORMING MEMORY CELLS

RELATED PATENT DATA

This patent resulted from a continuation of U.S. patent application Ser. No. 13/556,956, which was filed Jul. 24, 2012, which is now U.S. Pat. No. 8,653,496, and which is hereby incorporated herein by reference; which resulted from a continuation of U.S. patent application Ser. No. 12/872,899, which was filed Aug. 31, 2010, which issued as U.S. Pat. No. 8,247,789, and which is hereby incorporated herein by reference.

TECHNICAL FIELD

Memory cells and methods of forming memory cells.

BACKGROUND

Memory is often incorporated into integrated circuitry. The memory may be used, for example, in computer systems for storing data.

Memory may be fabricated as an array of individual memory cells, with each memory cell being configured to retain or store memory in at least two different selectable states. In a binary system, the storage conditions are considered as either a "0" or a "1".

Integrated circuitry fabrication continues to strive to produce smaller and denser integrated circuits. There is a continuing effort to reduce the number of components in individual devices because such can reduce the size of finished constructions, and can simplify processing. The smallest and simplest memory cell will likely be comprised of two conductive electrodes having a programmable material received between them. Such simple memory cells are often referred to as cross-point memory cells, in that they occur at the cross-point of overlapping conductivity lines.

Suitable programmable materials have two or more selectable resistive states to enable storing of information by an individual memory cell. The reading of the cell comprises determination of which of the states the programmable material is in, and the writing of information to the cell comprises placing the programmable material in a predetermined resistive state. If a memory cell has two selectable states, it is known as a single level cell. Memory cells that have four or more selectable memory states are known as multi-level cells.

Programmable materials that are receiving increasing interest are variable resistance memory materials, such as phase change materials which reversibly change from crystalline states to amorphous states with the application of current. The crystalline and amorphous states differ from one another in resistivity. Thus, data bits may be stored in the phase change materials as the phase of the material, with the phase of the material having relatively high resistivity being one type of data bit (either a "1" or a "0" in a single level cell), and the phase of the material having relatively low resistivity being another type of data bit. Variable resistance memory materials may be used in multi-level cells, as well as within single level cells.

Example phase change materials are chalcogenides, such as, for example $Ge_2Sb_2Te_5$.

Although cross-point memory cells show promise for utilization in integrated memory architectures, there remain challenges in constructing and utilizing such memory cells.

DETAILED DESCRIPTION OF THE ILLUSTRATED EMBODIMENTS

Some aspects of the invention recognize that localized heating of programmable material may be desired during programming of cross-point memory cells. For instance, localized heating may be utilized to induce a phase change within phase change material.

A problem with conventional (prior art) cross-point memory cells can be that heat dissipates beyond a region where localized heating is desired, and thus excessive power may be necessary to achieve enough heating to induce a desired phase change. Also, the dissipation of the heat may reduce reliability of a memory array by reducing the uniformity of performance characteristics across the numerous memory cells of the memory array. Further, the dissipated heat and/or excessive power may induce thermal damage into regions adjacent the memory cells. Accordingly, some embodiments include new memory cells having heating elements built therein. The heating elements can improve controllability of heat generation within the memory cells, and can therefore alleviate or prevent the heat dissipation problems associated with prior art memory cells. Another advantage of the heating induced with the heating elements is that such heating may be localized in a region of an interface of phase change material and a bottom electrode, which can promote phase change at such interface with less power (i.e., more efficiently) as compared to prior art processes. For instance, the heating and induced phase change may occur within a region that is less extended from the interface with the bottom electrode (in some aspects, less "mushroom-shaped" than prior art processes), which can lead to less power consumption.

Figure 1:
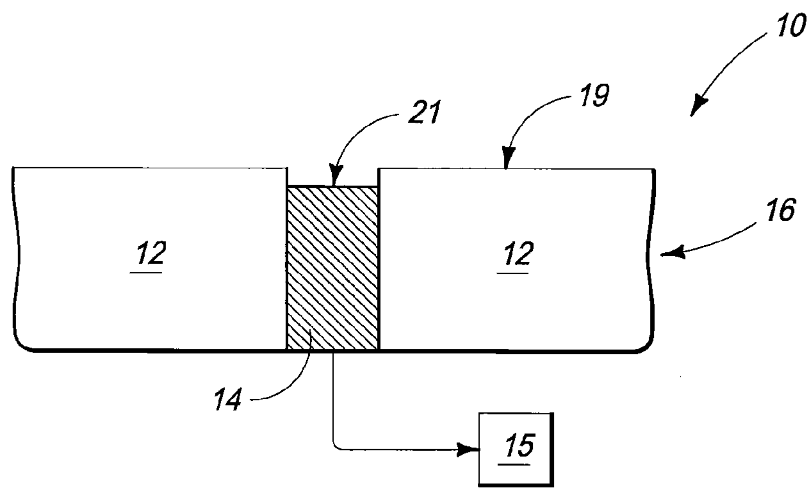
FIGS. 1-3 are diagrammatic cross-sectional views of a semiconductor construction at various stages of an example embodiment method for fabricating a memory cell.
Figure 2:
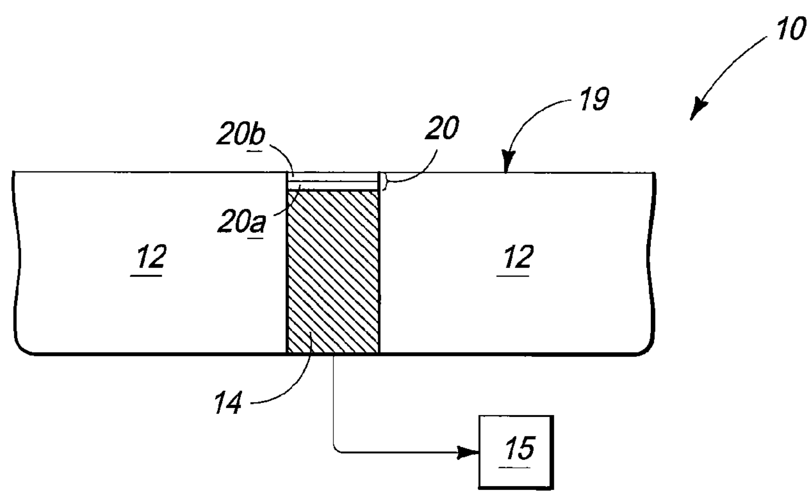
Figure 3:
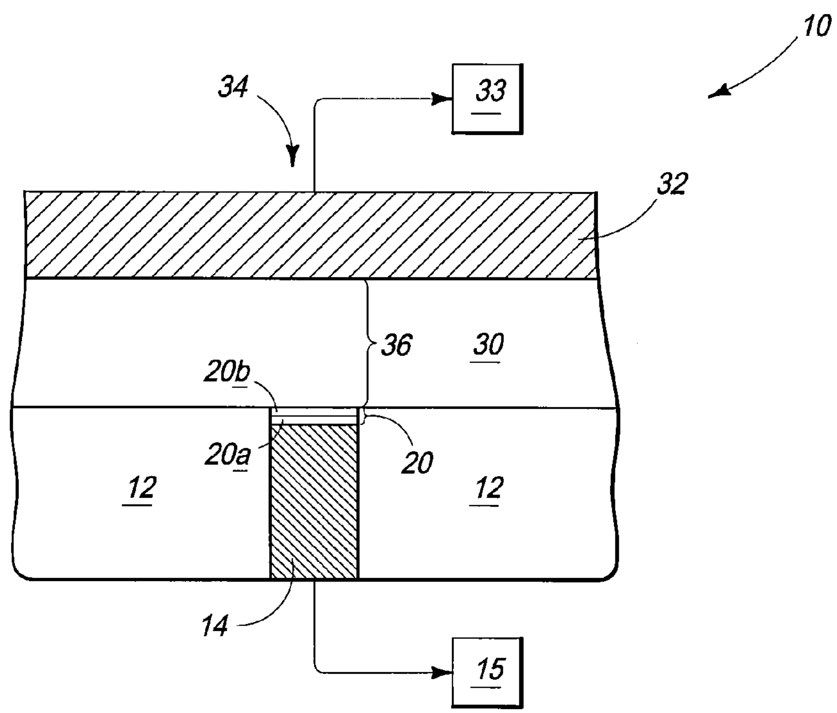

FIGS. 1-3 illustrate an example method for forming an example embodiment memory cell.

Referring to FIG. 1, a semiconductor construction 10 is shown to comprise an electrode 14 extending through a dielectric material 12.

Dielectric material 12 may comprise any suitable electrically insulative composition or combination of electrically insulative compositions; and in some embodiments may comprise, consist essentially of, or consist of one or more of silicon dioxide, various doped silicon oxides (e.g., borophosphosilicate glass, phosphosilicate glass, fluorosilicate glass, etc.), silicon nitride, etc. The dielectric material may be supported over a semiconductor substrate (not shown). The semiconductor substrate may include a semiconductor material (for instance, a monocrystalline silicon material) and various levels of integrated circuitry supported by the semiconductor material. Such integrated circuitry may include, for example, CMOS or other circuitry configured for addressing individual memory cells formed in accordance with the methodologies described herein. The electrode 14 may be electrically connected with such addressing circuitry, as is diagrammatically illustrated in FIG. 1 as an electrical connection to circuitry 15.

The electrode 14 may comprise any suitable electrically conductive composition or combination of compositions, and in some embodiments may comprise metal (for instance, tungsten, titanium, platinum, etc.), metal-containing substances (for instance, metal nitrides, metal silicides, etc.) and/or conductively-doped semiconductor materials (for instance, conductively-doped silicon, conductively-doped germanium, etc.). Although the electrode 14 is shown to be homogeneous, in other embodiments the electrode may comprise multiple discrete electrically conductive layers.

The dielectric material has an upper surface 19, and the electrode 14 has an upper surface 21 which is recessed relative to the upper surface 19.

The construction of FIG. 1 may be formed by any suitable processing. For instance, the dielectric material 12 may be formed over a semiconductor substrate (not shown); an opening may be formed through the dielectric material utilizing suitable masking and etching technologies; and then conductive material of the electrode 14 may be formed within the opening to a desired level. If the conductive material is formed to above the desired level, one or more etches may be used to remove excess conductive material and form the recessed surface 21.

Referring to FIG. 2, a cap 20 is formed over electrode 14. Such cap is more electrically resistive than electrode 14, and ultimately becomes a heating element. The cap 20 may be formed utilizing any suitable processing, and may comprise any suitable material. In the shown embodiment the cap fills the recess above electrode 14. In other embodiments, the cap may be formed to less than entirely fill such recess. It can be preferred that the cap not overfill the recess, and thus that the cap not extend outwardly of the upper surface 19 of dielectric material 12.

In the embodiment of FIG. 2, the cap 20 corresponds to a modified region of electrode 14. Such modified region may be formed by exposing the upper surface 21 (FIG. 1) to appropriate conditions that alter the chemical composition of the upper region of electrode 14. Such conditions may comprise implanting one or more elements into the upper region of electrode 14 to create a higher-resistivity region corresponding to cap 20. Suitable elements may include one or more of carbon, nitrogen, oxygen and silicon, depending on the initial composition of electrode 14.

In some embodiments the formation of cap 20 may comprise exposing the upper surface of electrode 14 to nitridizing conditions to thereby incorporate nitrogen into the upper region of the electrode.

In some embodiments the formation of cap 20 may comprise exposing the upper surface of electrode 14 to oxidizing conditions to thereby incorporate oxygen into the upper region of the electrode. Example oxidizing conditions include exposure of an electrode comprising, consisting essentially of, or consisting of TiN (titanium nitride) to an oxygen-containing plasma to thereby form the cap 20 to comprise, consist essentially of, or consist of TiON. The chemical formulas TiN and TiON indicate principle components of the compositions, rather than specific stoichiometries. For instance, in some embodiments TiON may comprise $TiO_xN_y$, where x and y are different from one another.

In the shown embodiment the cap comprises two layers 20*a* and 20*b*. Such cap may be formed by exposing a TiN electrode to an oxidizing plasma comprising $O_2$, $H_2$, and $N_2$ at a temperature within a range of from about room temperature to about 300° C. and under sub-atmospheric pressure. For instance, an example process may utilize a chuck temperature of about 240° C., a pressure of about 1000 mTorr, a microwave power of about 3500 watts, a flow rate of $O_2$ of about 6300 standard cubic centimeters per minute (sccm), and a flow rate of forming gas (3.8% $H_2$/96.2% $N_2$) of about 700 sccm.

The upper layer 20*b* may consist of $TiO_2$, and the lower layer 20*a* may consist of $TiO_xN_y$; where x is in a range of from greater than 0 to about 2, and where y is in a range of from about 0 to about 1. The $TiO_xN_y$ may comprise concentration gradients of O and N, with a lower portion of layer 20*a* having a stoichiometry approaching TiN and an upper portion of the layer having a stoichiometry approaching $TiO_2$.

The cap 20 may correspond to a region of electrode 14 that has swollen due the incorporation of nitrogen, oxygen, and/or other elements therein.

Similar processing to that discussed above relative to a titanium nitride electrode may be utilized with other electrodes to form dual-layer oxides over such other electrodes. For instance, dual-layer tantalum oxide may be formed over a tantalum nitride electrode in some embodiments.

The cap 20 is preferably very thin, and may, for example, have a thickness in a range of from about 2 nanometers to about 30 nanometers; and in the shown embodiment the layer 20*a* may have a thickness within a range of from about 2 nanometers to about 20 nanometers.

Other techniques besides plasma oxidation may be used for forming the dual-layer oxide 20 shown in FIG. 2. Such other techniques may include slot plane antenna (SPA) methods and/or gas cluster ion beam (GCIB) methods.

In some embodiments the formation of cap 20 may comprise exposing an entirety of the upper surface of construction 10 to appropriate conditions to form the modified upper region of the electrode 14 corresponding to cap 20. Such exposes the upper surface 19 (FIG. 1) of dielectric material 12 to the conditions that form the modified upper region of electrode 14. If there is a possibility that the conditions utilized to form the modified upper region of electrode 14 may detrimentally affect the upper surface of dielectric material 12, a protective mask (not shown) may be provided over the upper surface of dielectric material 12 to protect such upper surface during the formation of the modified upper region of electrode 14. The protective mask may be subsequently removed to leave the construction shown in FIG. 2.

Figure 2A:
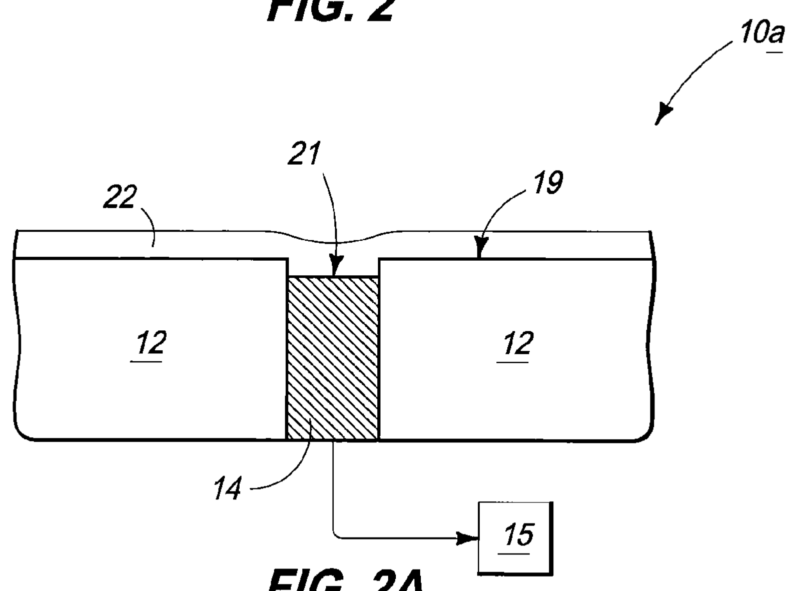
FIG. 2A shows a diagrammatic cross-sectional view of a semiconductor construction illustrating an alternative embodiment relative to that of FIG. 2.

FIG. 2A shows a construction 10*a* illustrating an alternative embodiment method for forming a dielectric cap across an upper surface of electrode 14. Specifically, a dielectric layer 22 has been deposited across the upper surface of construction 10. A region of the dielectric layer that is directly over electrode 14 corresponds to the cap 20. The dielectric layer 22 may be formed by any suitable processing, such as, for example, one or both of atomic layer deposition (ALD) and chemical vapor deposition (CVD). The layer 22 may comprise any suitable electrically insulative composition, and in some embodiments may comprise, consist essentially of, or consist of one or both of silicon dioxide and silicon nitride.

Although the layer 22 is shown extending across dielectric material 12 as well as across electrode 14, in other embodiments the layer 22 may be formed to be only over electrode 14. For instance, layer 22 may be formed entirely across surfaces 19 and 21, then a patterned mask (not shown) may be utilized to protect a region of layer 22 over electrode 14 while exposing the rest of layer 22 to an etch, and subsequently the protective mask may be removed to leave a construction in which layer 22 remains only over electrode 14. Alternatively, chemical-mechanical polishing (CMP) may be used to remove layer 22 from over surface 19 of the dielectric material while leaving the material 22 within the recess over surface 21 of the electrode. In yet other alternative embodiments, deposition conditions may be utilized which selectively deposit layer 22 onto an upper surface of electrode 14 relative to upper surfaces of dielectric material 12.

The layer 22 may be very thin in the recess over the electrode 14, and in some embodiments may have a thickness in a range of from about 2 nanometers to about 30 nanometers.

Referring to FIG. 3, construction 10 is shown at a processing stage subsequent to that of FIG. 2. Specifically, a programmable material 30 is formed across cap 20 and dielectric material 12; and an electrode 32 is formed over the programmable material. In some embodiments electrodes 14 and 32 may be referred to as first and second electrodes, respectively. In some embodiments electrode 14 may be referred to as a bottom electrode, and electrode 32 may be referred to as a top electrode.

The programmable material 30 may comprise any suitable composition or combination of compositions. In some embodiments programmable material 30 may be a variable resistance memory material, and for instance may be a phase change material that reversibly changes from crystalline phase to amorphous phase with the application of current. Example phase change materials are chalcogenides; such as compositions containing germanium (Ge), antimony (Sb) and tellurium (Te). An example chalcogenide is a material having the stoichiometric formula $Ge_2Sb_2Te_5$.

The programmable material 30 may be formed by any suitable methodology, including, for example, utilization of one or more of ALD, CVD and physical vapor deposition (PVD).

Electrode 32 may comprise any suitable composition or combination of compositions, and in some embodiments may comprise, consist essentially of, or consist of one or more of various metals, metal-containing compositions, and conductively-doped semiconductor materials. The electrode 32 may be formed by any suitable methodology, including, for example, utilization of one or more of ALD, CVD and PVD.

A memory cell 34 comprises electrode 14, electrode 32, cap 20, and a region 36 of programmable material 30 that is directly between the electrodes 14 and 32. Such memory cell may be representative of a large number of substantially identical memory cells that are formed simultaneously with one another to create a memory array. In some embodiments the memory cell may include other components (not shown) besides the electrodes, the resistive cap, and the programmable material. For instance, the memory cell may also include a select device, such as a diode.

Electrode 32 is shown connected with circuitry 33. In some embodiments the circuitry 15 may comprise one series of lines of a memory array, and the circuitry 33 may comprise any another series of lines of the memory array (for instance, the circuitry 15 may comprise wordlines while the circuitry 33 comprises bit lines, or vice versa). The memory cell 34 may be uniquely addressed by a combination of one line from the first series and one line from the second series; and all memory cells of the memory array may be similarly uniquely addressed.

Figure 4:
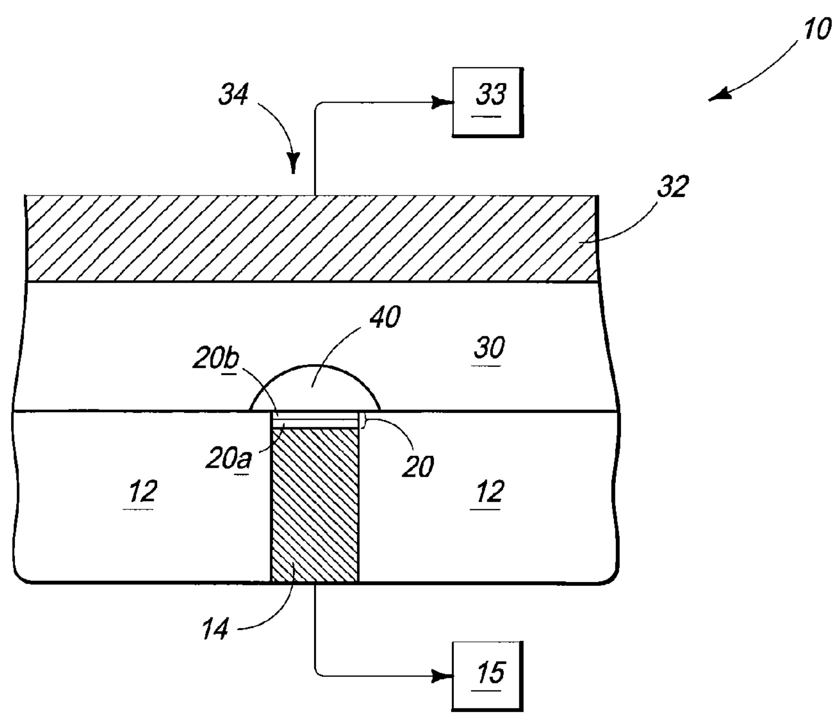
FIG. 4 is a diagrammatic cross-sectional view of an example embodiment memory cell in a mode of operation.

An advantage of the electrically resistive cap 20 is manifested during programming of memory cell 34, as shown in FIG. 4. Specifically, the electrically resistive cap 20 functions as a heating element to induce localized heating within a region of programmable material 30 directly adjacent to the cap 20. The heating causes a physical change within the region of programmable material 30 exposed to such heating and thus creates a physically-modified region 40 within programmable material 30. If programmable material 30 comprises a phase change material (such as, for example, a chalcogenide), the physical change may be a change in crystallinity. For instance, programmable material 30 may be initially in a crystalline form, and the physically-modified region 40 may correspond to an amorphous form of the programmable material.

The terms "crystalline" and "amorphous" are used relative to one another to indicate the different phases of regions of the programmable material. The crystalline form of the programmable material may be 100 percent crystalline, or less than 100 percent crystalline; but will be more crystalline than the amorphous form of the programmable material. Similarly the amorphous form of the programmable material may be 100 percent amorphous, or less than 100 percent amorphous; but will be less crystalline than the crystalline form.

The physically-modified region 40 will have different resistivity than a remainder of programmable material 30. Thus, formation of physically modified region 40 changes resistivity within the memory cell 34 and transforms memory cell 34 from an initial memory state into a different memory state. The memory cell may be returned to the initial memory state by utilizing the heating element corresponding to cap 20 to provide appropriate thermal energy to transform region 40 back to the initial crystalline state of the programmable material 30.

The heating element corresponding to cap 20 enables the heating of programmable material 30 to be localized within a region directly adjacent to cap 20. The heating element can enable power to be efficiently utilized for creating sufficient heat within the programmable material to induce desired physical change (for instance, phase change) within the material. Accordingly, the heating element can eliminate, or at least alleviate, problems associated with heat dissipation from electrodes of prior art constructions.

Figure 5:
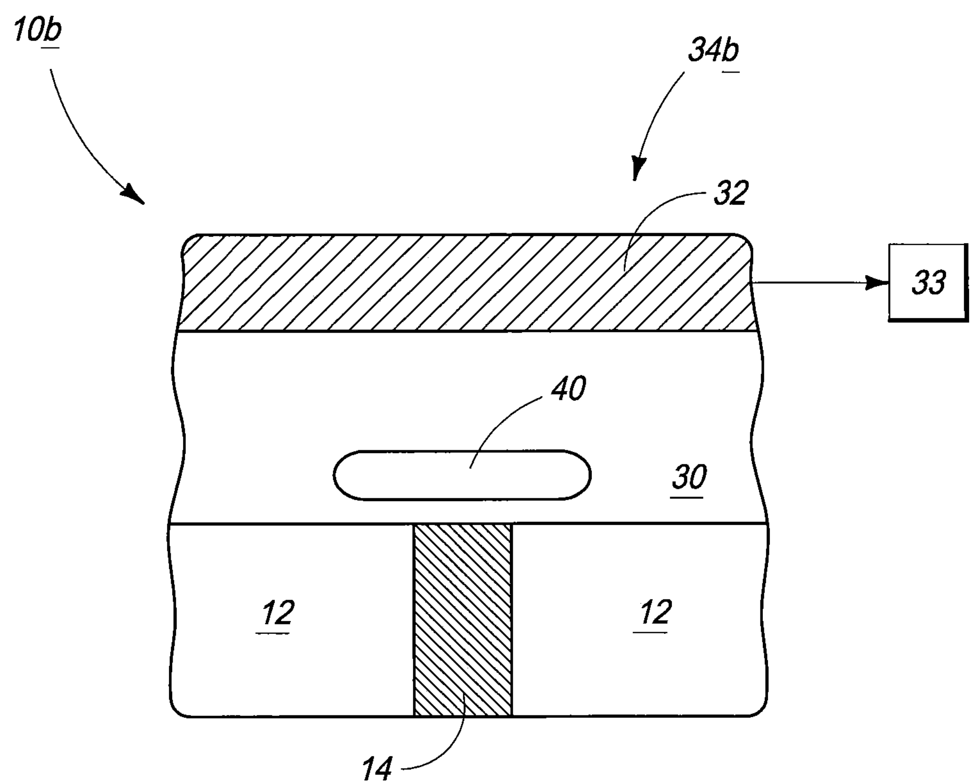
FIG. 5 is a diagrammatic cross-sectional view of a prior art memory cell in a mode of operation analogous to the mode of operation shown in FIG. 4.

FIG. 5 shows a construction 10*b* containing a prior art memory cell 34*b*. The memory cell 34*b* is analogous to the memory cell 34 of FIG. 4, but lacks the heating element corresponding to cap 20. The flow of current into memory cell 34*b* creates heat within programmable material 30 to form a physically-modified region 40. However, the heating is not localized in a region directly adjacent to the electrode 14, and thus modified region 40 is spaced from electrode 14 by an intervening region. The amount of spacing may vary from memory cell to memory cell, and thus there may be less uniformity and reliability across a memory array containing memory cells 34*b* of the prior art than is achieved utilizing a memory cell 34 of the FIG. 4 example embodiment. Accordingly, memory cells of the present invention (for example, the memory cells of FIGS. 3 and 4) may provide significant advantages relative to prior art memory cells.

Although FIGS. 3 and 4 describe memory cells utilizing the construction of FIG. 2, in other embodiments the construction of FIG. 2A may be incorporated into memory cells analogous to those of FIGS. 3 and 4. Such memory cells may be utilized analogously to the memory cells of FIGS. 3 and 4.

Memory cells of the present invention may be incorporated into integrated circuitry associated with a semiconductor chip. The chip may be incorporated into a package, and such package may be utilized in any suitable electronic system. Example electronic systems are clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A device comprising:

a structure over a titanium-nitride-containing surface of an electrode, the structure comprising a region including titanium, nitrogen and oxygen, a ratio of nitrogen to oxygen within the region being configured as a gradient of decreasing nitrogen concentration with the highest nitrogen concentration being proximate the electrode; and programmable material over the structure.

2. The device of claim 1 wherein the programmable material comprises $Ge_2Sb_2Te_5$.

3. The device of claim 1 wherein the programmable material comprises phase change material.

4. The device of claim 1 wherein the programmable material comprises a chalcogenide.

5. The device of claim 1 wherein the structure has a thickness in a range of from about 2 nanometers to about 30 nanometers.

6. The device of claim 1 wherein the region is a first region, and further comprising a second region consisting of $TiO_2$ between the programmable material and the first region.

7. The device of claim 1 wherein the programmable material is switchable between two different resistive states.

8. A device comprising:

a structure over a metal-nitride-containing surface of an electrode; the structure comprising first and second portions containing combinations which include all three of metal, nitrogen and oxygen; the first portion being proximate the electrode, the second portion being over the first portion, a ratio of nitrogen to oxygen within the first portion being larger than that within the second portion; and a programmable material over the structure.

9. The device of claim 8 wherein the programmable material comprises $Ge_2Sb_2Te_5$.

10. The device of claim 8 wherein the programmable material comprises phase change material.

11. The device of claim 8 wherein the programmable material comprises a chalcogenide.

12. The device of claim 8 wherein the structure has a thickness in a range of from about 2 nanometers to about 30 nanometers.

13. The device of claim 8 wherein the first portion has a stoichiometry approaching TiN.

14. The device of claim 13 wherein the second portion has a stoichiometry approaching $TiO_2$.

15. A device comprising:

a structure over a metal-nitride-containing surface of an electrode, the structure comprising a layer including metal, nitrogen and oxygen, where the metal is in common with metal of the electrode; the layer comprising first and second portions, the second portion being over the first portion, a concentration of oxygen within the first portion being less than a concentration of oxygen within the second portion; and a programmable material over the structure.

16. The device of claim 15 wherein the metal is "M", where the first portion comprises $MO_xN_y$, where x is in a range of from greater than 0 to about 2, and where y is in a range of from greater than or equal to 0 to about 1.

17. The device of claim 16 wherein the first portion has a stoichiometry approaching MN.

18. The device of claim 16 wherein the second portion has a stoichiometry approaching $MO_2$.

19. The device of claim 15 wherein the metal is titanium.

* * * * *